US006239359B1

(12) United States Patent
Lilienthal, II et al.

(10) Patent No.: US 6,239,359 B1
(45) Date of Patent: May 29, 2001

(54) CIRCUIT BOARD RF SHIELDING

(75) Inventors: Peter Frederick Lilienthal, II, Princeton; Fred William Verdi, Lawrenceville, both of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/309,943

(22) Filed: May 11, 1999

(51) Int. Cl.[7] .................................................. H05K 9/00
(52) U.S. Cl. .................... 174/35 GC; 174/35 R; 361/816; 361/752; 361/753
(58) Field of Search .................. 174/35 R, 35 MS, 174/35 GC; 361/816, 818, 752, 753

(56) References Cited

U.S. PATENT DOCUMENTS 5,847,938 * 12/1998 Gammon ............................. 361/816

* cited by examiner

Primary Examiner—Dean A. Reichard
Assistant Examiner—Hung V Ngo
(74) Attorney, Agent, or Firm—Henry I. Schanzer, Esq.

(57) ABSTRACT

An EMI shield for use on a printed wiring board (PWB) of a circuit pack includes an open-ended box-like structure having a laterally extending flange completely encircling the opening into the box-like structure. The box is of an EMI impervious material, preferably stainless steel. An electrically conductive O-ring gasket is disposed in a groove in the flange. Both the groove and the flange completely encircle the box opening. The shield is secured to a PWB by pegs secured to the flange at positions radially outwardly of the gasket and extending entirely through openings through the PWB. Preferred pegs comprises pairs of side-by-side prongs integral with the shield flange but extending downwardly therefrom. Each prong terminates in an oppositely directed, return-bent detent with the detent pairs functioning as a spring-biased latch for removably mounting the shield to the PWB.

9 Claims, 4 Drawing Sheets

CIRCUIT BOARD RF SHIELDING

BACKGROUND OF THE INVENTION

This invention relates to circuit boards on which are mounted various electrical and/or optical components, and particularly to electromagnetic interference (EMI) shields used with such components.

A common practice in the telecommunications industry and the like, where huge banks of electrical and/or optical components are used, is to mount numerous such components on printed wiring boards forming part of "circuit packs" and to mount the circuit packs in closely packed, side-by-side relation on grooved shelves within electrical cabinets. Each circuit pack printed wiring board (PWB) includes metal plated surface areas on which electrical and/or optical components are mounted and by means of which the components are electrically interconnected to one another and to various terminal connectors mounted, typically, at the front and rear ends of the circuit packs. The terminal connectors removably mate with connectors fixedly mounted on the cabinets whereby the various components on each circuit pack can be interconnected to other components within the electrical cabinet or, by means of interconnecting cables, to other components elsewhere in the telecommunication network.

Some of the electrical "components" (including combinations of devices and circuit elements) operate at quite high frequencies and, for shielding the components from being interfered with or interfering with other high frequency components, the respective components are disposed within shields mounted on the PWB and electrically grounded to grounded metal areas of the PWB.

One type of EMI shield, perhaps most closely related to the present invention, is known as a "casting" (from its method of fabrication) and, as shown in FIG. 1, comprises a generally flat plate including a number of ribs 10 or ledges extending from one surface of the plate. Typically, the casting is relatively large and a single casting encloses substantially all of one side of the PWB on which the components are mounted. All of the ribs are of the same height, and all the ribs engage a common surface of the PWB for forming (typically) a plurality of separate EMI shielded spaces or cavities for respective components on the PWB. For providing a tight fit of the ribs against the PWB surface, spaced apart openings 12 are provided directly vertically through the ribs for receipt (FIG. 2) of screws 14 for screwing the casting to the PWB. The openings 12 pass through enlarged area portions 16 of the ribs.

The pattern of cavity defining ribs (including a peripheral rib defining a continuous side wall of the casting) varies depending upon the design of the particular PWB with which each casing is to be used, and the castings tend to be relatively expensive owing to tooling costs. Also adding to the cost of the castings is that, for ease of fabrication and lightness of weight, the castings are of cast magnesium, a relatively expensive material.

While generally satisfactory for their purpose, although somewhat expensive, a problem arises with the use of such castings in situations where extremely high frequencies are involved. With such high frequencies, it is found that EMI leakage occurs through extremely small spaces between the casting ribs and the PWB surface caused by slight variations in the flatness of the PWB surface. A known solution for this problem is to coat the rib end surfaces with an elastic, electrically conductive silicone compound. The elastic silicone compound serves as an electrically conductive sealing gasket 18 (FIG. 2). Two problems exist. One is that the conductive silicone compound is provided by "in place" technology, i.e., it is beaded onto the ribs similarly as caulking is applied from a caulking gun. This is time consuming and expensive, and it is particularly difficult to apply the compound around the rib enlarged screw receiving areas 16. Secondly, to retain the beaded material in place, the material is cured. A problem with this is that the cured material adheres so well to the casting ribs that complete removal of the cured material is extremely difficult and practically impossible. An increasingly prevalent requirement for materials used in various industries is that the materials be recyclable. The magnesium castings, by themselves, are readily recyclable, but are not so when including cured conductive gaskets.

Another type of EMI shield extensively used with PWBs is a two piece shield (not illustrated) comprising a "fence" and a "lid". The fence is an annular member comprising a sheet metal wall enclosing an open space. In use, the bottom surface of the wall is engaged with a grounded, metal plated surface of the PWB by means of wall peg extensions which are press-fitted through corresponding openings through the PWB. The pegs are then soldered in place. The annular wall or "fence" encloses an area of the PWB surface on which components are mounted. A problem with the use of such fences is that the fences must be mounted in place prior to the mounting of the components for preventing damage to the components by the fence solder mounting process. Thus, the fence shield must be completed by a lid press-fitted over the fence wall and covering the component filled enclosed space.

Advantages of the two piece shield are that it is relatively inexpensive; the fence mounting and soldering processes are readily done by machine; and the press-fitted lid, while requiring a separate mounting operation, can be removed for access to the shielded components.

A problem with such two piece shield, however, is that no simple and readily applied means are presently known for adding fully effective elastic shielding means for electrically closing tiny spaces between the fence bottom surface and the PWB surface. Also, even with tight fits of the lids to the fences, tiny gaps invariably exist allowing passage of extremely high frequency EMI.

What is required, and provided by the present invention, is a simple and inexpensive shield which can be easily and removably mounted on a PWB and which includes elastic conductive means, i.e., an elastic gasket, for completely electrically engaging bottom surfaces of the shield with an irregularly flat surface of a PWB.

SUMMARY OF THE INVENTION

An EMI shield for use on a PWB comprises an open, box-like structure comprising a bottom wall integral with a side wall completely encircling the bottom wall. An integral, laterally and outwardly extending flange is disposed at the side wall upper end and continuously therearound. An annular gasket of an electrically conductive elastomer is disposed within an upwardly opening groove in the flange. The groove, and gasket therein, completely encircle the opening into the box-like portion of the shield. The groove is disposed inwardly from the outside edge of the flange.

In use, the shield is mounted on a surface of a PWB with the flange gasket clamped between the shield flange and a conductive metal area on the PWB surface. The flange is clamped in place, with the shield bottom wall spaced above the PWB surface for providing an EMI shielded space, by pegs extending through openings through the PWB. The pegs are spaced apart around the flange, and are disposed in first embodiments of the invention, between the gasket and the flange outside edge, and in second embodiments of the invention, are disposed along the flange outside edge.

Preferably, the pegs are spring-biased to form compressive seals between the gasket and the PWB surface. In a preferred embodiment, the pegs each comprises a pair of side-by-side prongs stamped from the flange and extending downwardly therefrom. The prongs terminate in oppositely directed detents providing, in combination, a spring-biased latch for removably and elastically locking the pegs against the bottom surface of the PWB.

DESCRIPTION OF THE DRAWINGS

The drawings are not necessarily to scale.

DESCRIPTION OF PREFERRED EMBODIMENTS

The use of electronic cabinets containing shelves and circuit packs for removable mounting on the shelves is well known; see, for example, U.S. Pat. No. 5,147,121, the subject matter of which is incorporated herein by reference. The circuit packs typically comprise a face plate (vertically oriented when the circuit pack is mounted on a cabinet shelf) and a horizontally extending printed wiring board (PWB) of known type, e.g., a rigid board of a dielectric material having a pattern of electrically conductive areas "printed" on one or both major surfaces of the board. Various electronic and/or optical components are physically mounted on the PWB and electrically interconnected via the conductive surface areas.

Figure 1:
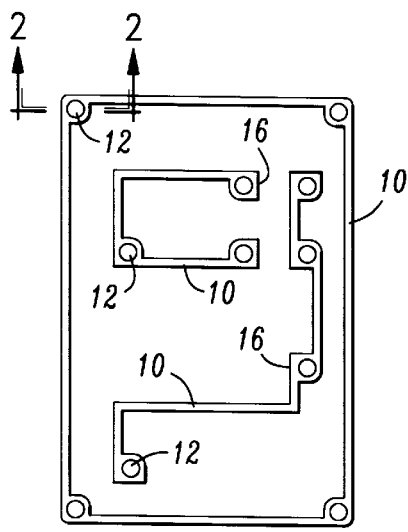
FIG. 1 is a top view of a known "casting" shield.
Figure 2:
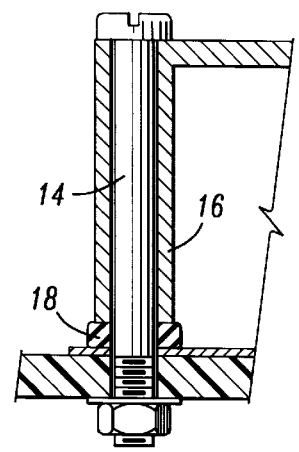
FIG. 2 is a sectional view of the shield shown in FIG. 1 taken along line 2—2 thereof.
Figure 3:
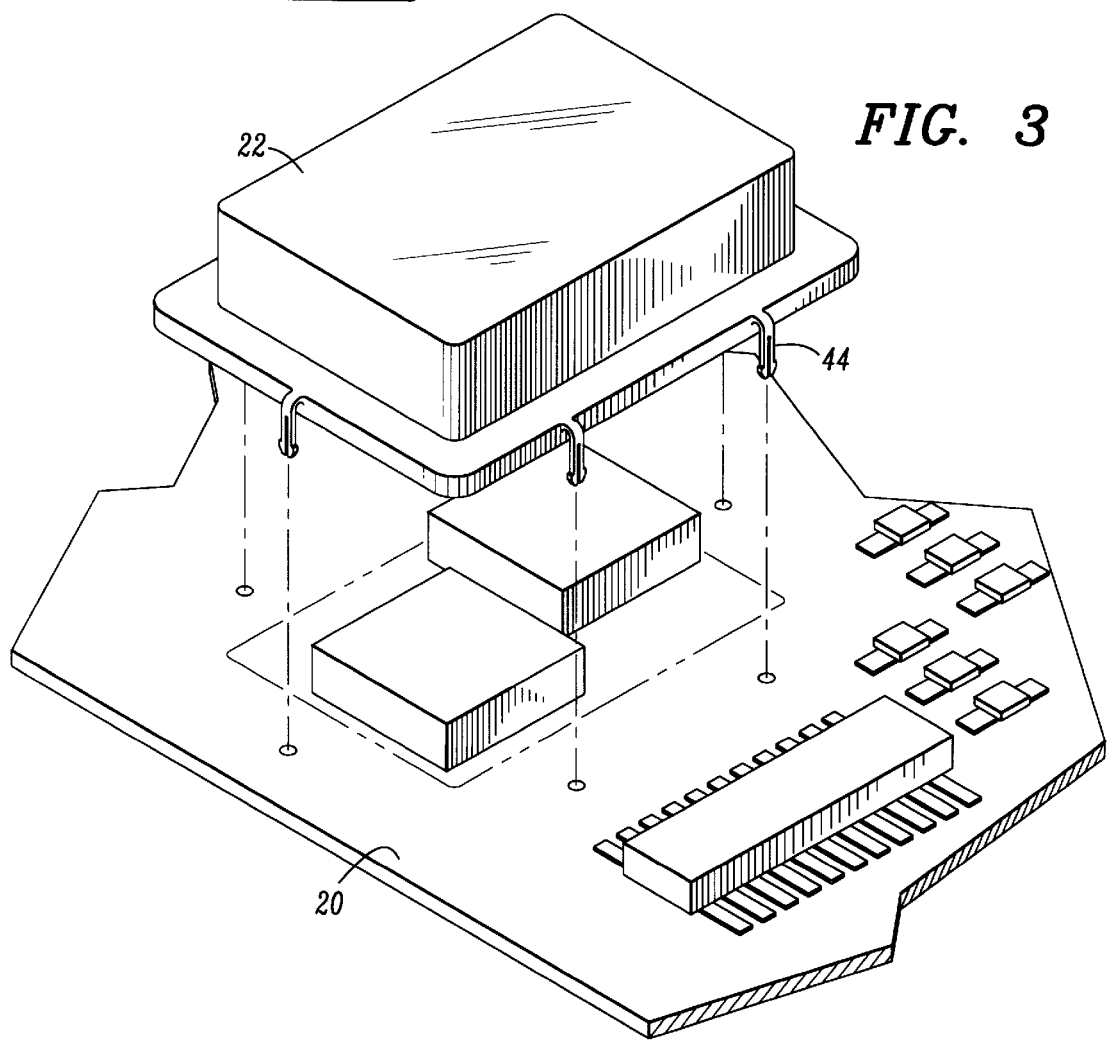
FIG. 3 is a view, in perspective and exploded, of a shield according to this invention for being mounted on a printed circuit board.
Figure 4:
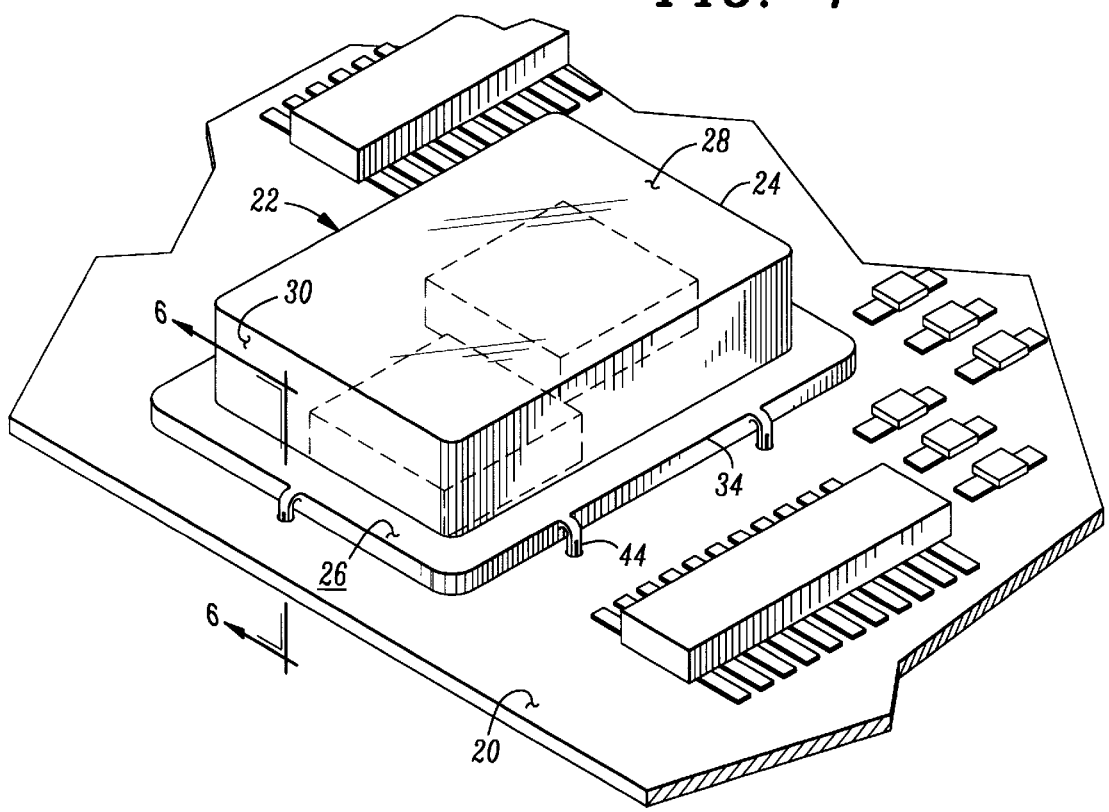
FIG. 4 is a view similar to FIG. 3 but with the shield firmly mounted on the printed board.

In FIGS. 3 and 4, only a portion of a known type of PWB 20 forming part of a known circuit pack is shown having mounted thereon a number of electrical and/or optical components. In accordance with this invention, an EMI shield, such as the shield 22 shown in FIGS. 3 and 4, is provided for being removably but firmly mechanically and electrically secured to the PWB for defining an EMI shielded space surrounding one or more components mounted on the PWB 20.

In contrast to known and previously described "castings" of large size containing ribs for defining separate shielding cavities, the inventive shields are preferably of relatively small size and each provides but a single shielded space. This reduces the cost and complexity of the shields. Also, in contrast to the known and previously described two piece "fence and lid" shields secured to the PWB by soldered joints, the inventive shields are preferably of a single part removably secured to the PWB by spring-biased fastening pegs. An advantage of this is that the various components to be shielded can be mounted on the PWB prior to the mounting of the shield, thus providing greater space for, and access to, the components for mounting, testing and adjustment procedures.

The inventive shields, similarly as the prior described shields, comprise basically a hollow shell of electrically conductive material for enclosing a space above the PWB in which are mounted components to be shielded. The shields are each firmly, completely and electrically engaged with a grounded metal surface of the PWB, and complete EMI shielding is provided by the combination of the electrically connected enclosing shield and the underlying PWB.

In terms of function, the inventive shields comprise two portions; a "hollow" portion comprising a "continuous" wall enclosing a shielded space, and a flange portion integral with and completely encircling the hollow portion for removably and "hermetically" EMI sealing the hollow portion to the surface of a PWB.

For purpose of EMI shielding, a mechanically continuous (impervious) wall is not required; a wire mesh sufficiently tightly woven for the frequencies involved will provide complete shielding. An equivalent of such tightly woven wire mesh wall is a bound matrix of electrically conductive particles, e.g., silver particles embedded within a plastic plate. Also, shields of molded plastic can be used containing electrically conductive coatings on inner walls of the shields. Any such materials can be used with the inventive shields, but the preferred materials are known ductile metals, e.g., stainless steel, brass, copper and the like, workable by known procedures such as stamping (and bending), deep drawing and photo-etching. Shield wall thicknesses are not critical and are dependent upon the size of the shields. Thicknesses can typically range from 0.001 to 0.060 inch.

Figure 5:
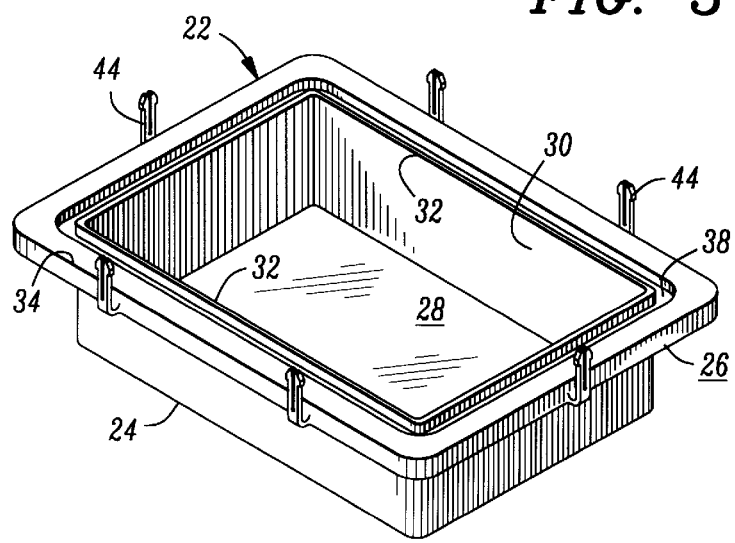
FIG. 5 is a view, in perspective, showing the shield shown in FIGS. 3 and 4 by itself and in "upright" position.

An illustrative shield 22 shown in FIGS. 3–5 is preferably of stainless steel, e.g., formed from a starting metal plate of 0.005 mil thickness, and comprises a rectilinear box-like hollow portion 24 and an encircling, integral flange 26. For ease of description, it is convenient to describe the shield 22 as having "upper" and "lower" portions; the hollow portion 24 of the shield 22 (shown inverted in FIGS. 3 and 4) thus comprising a flat bottom (or base) wall 28 integral with peripheral and "upwardly" (FIG. 5) extending side walls 30. The bottom 28 and side walls 30 define an inside space having an opening defining edge 32 (FIG. 5) provided by the side wall upper ends. The upper ends of the side walls 30 (of equal heights) are integrally joined to the aforementioned flange 26 which extends laterally and outwardly from the side walls 30 and which terminates in a flange outer edge 34. The flange 26 is of annular shape and completely surrounds the hollow portion 24 of the shield.

Disposed in the upwardly facing surface of the flange 26 and extending completely around the shield hollow portion 24 is a groove 38 of, in this embodiment, rectilinear cross-section. Disposed within the groove 38 (See FIG. 6), and extending along the complete length thereof (but not shown in FIG. 5), is an annular EMI gasket 40 of an elastomeric, i.e., elastic, rubber-like material, containing conductive metal particles. The gasket can be mechanically similar to known type O-ring gaskets used for mechanical sealing purposes and, in this embodiment, is of circular cross-section with a cross-sectional diameter greater than the depth of the groove 38. As with known O-rings, the gasket 40 is made with a length just slightly less than the peripheral length of the groove 38, hence the gasket 40 is self-seating when slightly stretched and press-fitted into the groove 38.

The use of elastomer, EMI sealing gaskets is known; such gaskets being used, for example, as EMI seals along the door jambs of electronic cabinets of the type herein described. Typical, commercially available elastomer materials suitable for use in gaskets according to the present invention include, e.g., ethylene propylene diene monomer (EPDM) rubber and various elastic silicon compounds. The conductive particles can be of such metals as silver, copper and aluminum, and the like.

Figure 6:
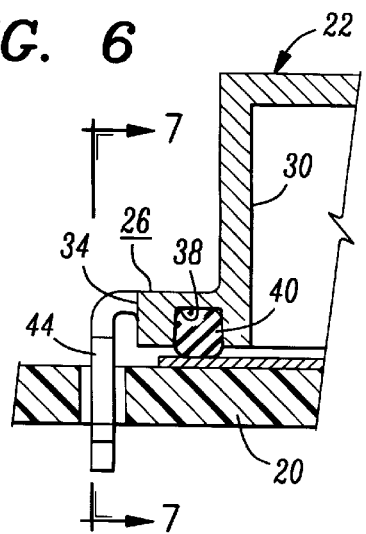
FIG. 6 is a cross-section taken along line 6—6 of FIG. 4 and showing the engagement of a gasket shown in FIG. 5 with a surface of the printed board.

As shown in FIGS. 5 and 6, the gasket containing groove 38 is disposed inwardly from the outer edge 34 of the flange 26, and the flange area between the flange edge 34 and the gasket 40 is "external" to the shielded space circumscribed by the gasket. This "external" area is used for removably but firmly and securely fastening the shield to the PWB.

Because the flange "external" area is outside the shielded space, fasteners of electrically non-conductive materials can be used. Most simply, perhaps, openings can be provided through and along the flange external area by means of which screws or bolts can be used for securing the flange to the PWB and firmly clamping the shield gasket 40 against the PWB surface.

Figure 7:
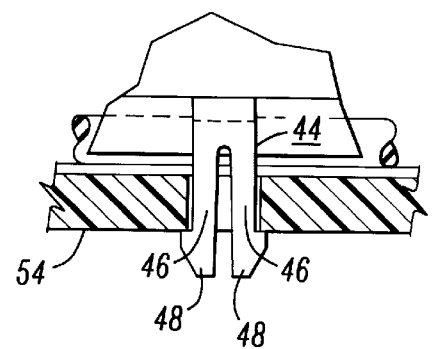
FIG. 7 is a cross-section taken along line 7—7 of FIG. 6 showing a peg for removably mounting the shield on the printed board.
Figure 14:
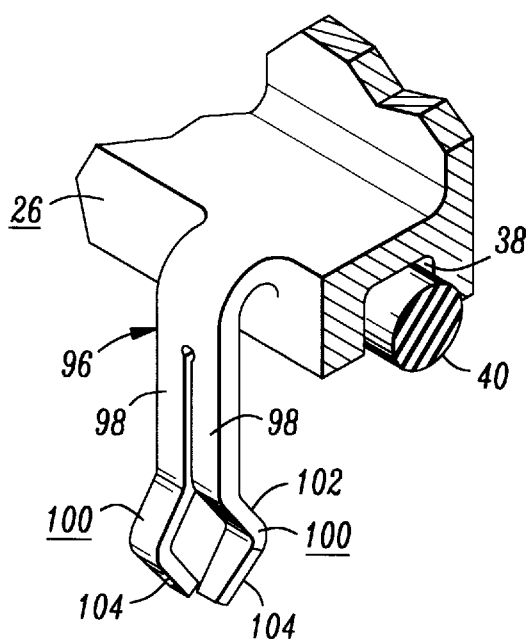
FIG. 14 is a view, in perspective, showing a peg attachment arrangement similar to that shown in FIG. 6.

In preferred embodiments, however, the means used for securing the shield flange to the PWB are downwardly extending pegs which are integral with the flange. One such preferred embodiment is shown in FIGS. 6 and 7. (Another such preferred embodiment is shown in FIG. 14, hereinafter described.)

In the FIGS. 6 and 7 embodiment, the shield 22, of stainless steel and formed, for example, by deep drawing, includes a plurality of integral fastening pegs 44 spaced around the steel flange 26 as shown in FIGS. 3 and 4. Each fastening peg 44, as shown in FIGS. 6 and 7, comprises a pair of side-by-side downwardly extending narrow strips or prongs 46 each terminating in an enlarged and oppositely directed detent 48. Together, the two detents form an elastic latch by means of which the shield can be removably mounted on a PWB in spring-biased clamped relation (the spring bias being provided by the compressed gasket 40 and slight flexure of the shield flange 26). FIG. 4 shows the shield 22 mounted on a PWB 20.

Figure 8:
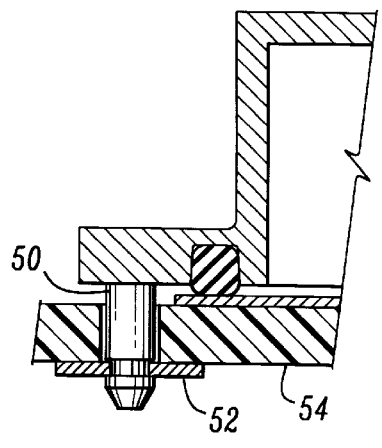
FIGS. 8–11 are similar to FIG. 6 but showing alternative versions of the engagement means shown in FIG. 6.

In embodiments where the shield is not made from an elastic metal, but rather from, e.g., a molded plastic material, a peg 50 such as shown in FIG. 8 can be used. The peg 50 is slightly longer than the peg 44 shown in FIG. 7 and includes a circumferential groove which is exposed beneath the bottom surface of the PWB when the shield is pressed fully downwardly during mounting of the shield on the PWB. Then, a C-ring spring 52 is force fitted into the groove and against the PWB bottom surface 54 to provide a desired tensile stress. (Such a C-ring spring can also be used in the FIG. 7 embodiment disposed between the PWB bottom surface 54 and the detents 48.)

Figure 9:
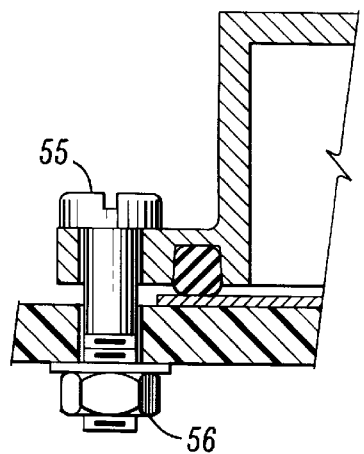
Figure 10:
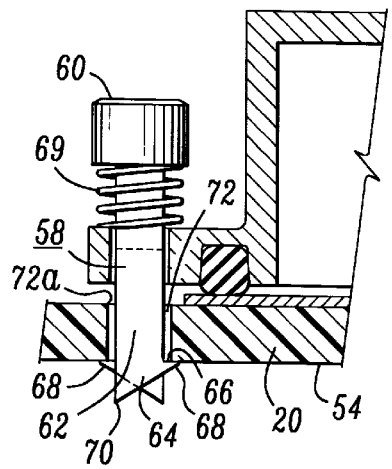

Other peg fasteners are shown in FIGS. 9 and 10.

FIG. 9 shows the use of a bolt 55 and nut 56.

FIG. 10 shows the use of a peg 58 having an enlarged rear end 60 and including, at the leading end, a pair of prongs 62 each terminating in an oppositely directed detent 64 including a laterally extending ledge 66 having an inclined lower surface 68 leading to a front, pointed end 70 of the prong. During insertion of the peg through an opening 72 in the PWB, the prong pointed ends 70 pass into the opening 72 until the inclined surfaces 68 engage an upper edge 72a of the opening 72. Continued downward pressure on the clip causes flexure of the prongs in directions allowing further entry of the detents through and outwardly from the opening 72. The flexed prongs then urge the detents 64 apart for overlapping engagement with the bottom surface 54 of the PWB 20. The prongs can be retracted through the opening 72 by simultaneously pressing, e.g., by hand, the two detents towards one another for reducing the lateral extent of the two detents. Also, the openings 72 can have an oblong shape whereby the detents can be simply twisted in a direction for passing through the opening along the opening elongated axis. The addition of a coiled spring 69 adds a desired spring bias. Also, the spring 69 provides a space allowing downward pushing of the peg for clearing the detents from the PWB bottom surface for easier access during peg removal.

Previously referred to FIGS. 6–10 additionally show the EMI seal formed by the elastomer gasket 40. As previously noted, the gasket 40 protrudes out of the groove 38 and beyond the "upper" surface of the flange 26. When the shield 22 is mounted (FIG. 4) on the PWB with the flange 26 pressed firmly against the surface of the PWB, the elastic gasket 40 is slightly compressed to completely fill (and seal) the groove 38 and to provide a flat gasket surface firmly pressed against the PWB. The elasticity of the gasket is sufficient to accommodate slight variations in the flatness of the PWB surface, hence provides a "substantially" complete EMI sealing between the metal flange 26 of the shield 22 and the metal surface of the PWB board.

Figure 11:
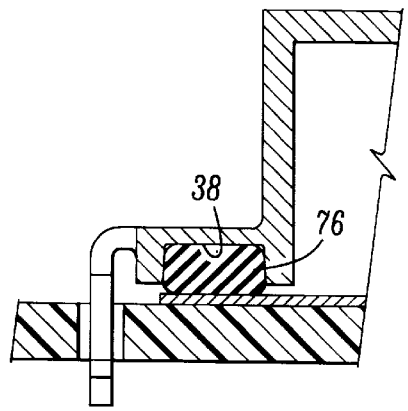

As just noted, the O-rings provide a "substantially" complete EMI shielding. In even more demanding situations, i.e., with higher and higher frequencies, O-gaskets 76 of the type shown in FIG. 11 are preferred. The gasket 76 is of rectangular cross-section to more completely fill the groove 38 and to provide a flat, PWB engaging surface somewhat larger than the flat surface of the slightly deformed O-rings 40 shown in FIGS. 6–10. Still more complete shielding is provided by the use of a conductive adhesive for providing a continuous and lower resistance contacting surface between the gasket 76 and the groove surfaces. Self-adhering, "pressure-sensitive" gaskets are known and are commercially available. The gasket 76 is still a separate O-ring elastically snapped in place (and "captured") within the groove 38, hence, the adhesive need only "weakly" adhere the gasket in place. Specifically, the adhesive is not chemically bonded to the groove walls and is readily removed from the groove 38. The significance of this has previously been noted and is further hereafter discussed.

Figure 12:
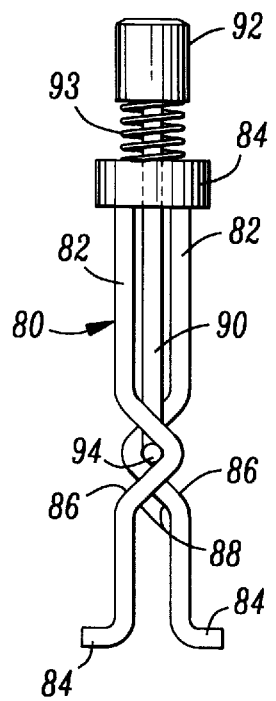
FIGS. 12 and 13 are side elevational views, at right angles to one another, showing a further embodiment of a peg for removably mounting an inventive shield on a printed board.
Figure 13:
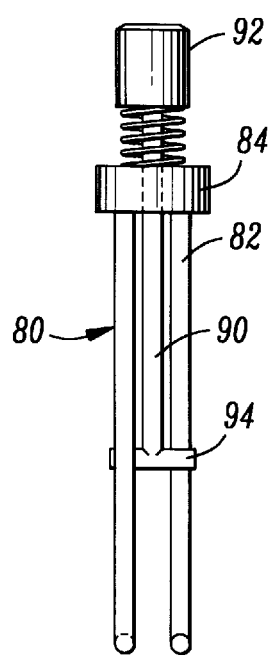

FIGS. 12 and 13 show a still further fastening peg 80. The peg 80 comprises two prongs 82 secured to an enlarged rear end 84. The front ends of the prongs terminate in oppositely directed bent detents 84. Intermediate the front and rear ends of the peg, the prongs include oppositely directed return-bent sections each including inclined surfaces 86 and 88. A push pin 90 is slidably mounted through the rear end 84. The pin 90 has an enlarged rear head 92, and a coiled spring 93 is disposed between the pin head 92 and the peg rear end 84. The vertically extending pin 90 terminates in a short bar 94 extending transversely of the vertical axis of the pin. As shown, the two prongs 82 are laterally spaced apart with the push pin 90 disposed (FIG. 13) between the two prongs. The transverse bar 94 at the end of the push pin 90 extends into contact with the two return-bent sections of the prongs 82.

In use, when the push pin 90 is pushed downwardly through the rear end 84 and against the coiled spring 93, downward movement of the transverse bar 94 against the return-bent section inclined surfaces 86 causes spring flexure of the prongs for forcing the front detents 84 towards one another. This allows passage of the detents through a PWB opening, not shown. When the detents have passed entirely through the opening, the bent legs tend to spring apart owning to the spring flexed prongs and compressed spring 93.

The outwardly extending detents 84 clamp against the bottom surface of the PWB for securing the shield in place. Pushing the push-pin 90 downwardly, for forcing the detents 84 towards one another, allows retraction of the prongs 82 through the PWB opening and removal of the shield.

FIG. 14 shows a further peg fastener 96 which is similar to the peg fastener 44 shown in FIG. 7 in that the fastener 96 includes two side-by-side prongs 98 each terminating in an oppositely directed detent 100. The two detents are each return-bent providing inclined surfaces 102 and 104.

In use, when the peg 96 is passed downwardly for passage through an opening (not shown) in the PWB, the lead ends of the detents 100 enter into the opening until the bottom inclined surfaces 104 engage the edge of the PWB opening. Pressure of the edge against the surfaces 104 forces the detents towards one another and into overlapped, reduced lateral dimension relationship. The detents thus pass through the opening and then tend to spring apart owing to the flexure of the prongs caused by the inward squeezing of the detents.

Preferably (but not illustrated), the dimension of the shield and gasket are such that with the gasket 40 firmly pressed against the PWB surface (similarly as shown, for example, in FIGS. 6–11), the detents do not extend entirely through the PWB opening, but extend only partially therebeyond with the detent upper inclined surfaces 102 engaged with the bottom edge of the PWB opening. The prongs 98 remain slightly flexed, thus tending to urge the detents apart, thus firmly clamping the detents in spring biased relationship with the PWB opening edge. While the shield is thus firmly clamped in place owing to the compressed gasket 40, the shield is readily removed by exertion of an upward force, e.g., by a screw driver blade inserted between the shield flange 26 and the PWB surface for forcing the detents together for upward passage through the PWB opening.

In the preferred embodiments described, the various sealing gaskets are in the form of annular O-rings of known type and materials and are readily fabricated using known processes. A significant advantage of the use of such pre-formed annular gaskets is that, because the gaskets are held in place either simply by elastic forces or, as with the gasket 76 shown in FIG. 11, additionally by a "weak" adhesive, the gaskets can be easily removed. Specifically, the gaskets are not chemically bonded in place, as are "in-place" beaded and cured gaskets and, being easily and completely removable, do not interfere with recycling of the shields when the shields become non-usable. Such suitability for easy recycling is a requirement of new equipment for the European market, and is likely to eventually become a requirement in the U.S.

What is claimed is:

1. An EMI shield for mounting on a first surface of a printing wiring board, the shield comprising an EMI impervious wall shaped to define a hollow space having an innermost portion spaced along a first direction from an opening into said space, a flange secured to said wall along a line completely encircling said opening and having an outer edge spaced from said line, a groove in a second surface of said flange facing in said first direction, said groove forming a closed, first loop spaced from said line and completely enclosing said opening, an electrically conducting, elastic gasket disposed within and projecting outwardly of said groove in said first direction along the entire length of said groove, and a plurality of fastening members spaced apart along said flange along a second loop encircling said opening and disposed between said flange edge and said first loop, said fastening members extending in said first direction for securing said flange against said first surface of a printed wiring board and for elastically clamping the entire length of said gasket against said first surface.

2. A shield according to claim 1 wherein said fastening members include spring forming members for removably securing said shield in spring-biased, stressed relation with said first surface when the shield is mounted on a printed wiring board.

3. A shield according to claim 2 wherein said fastening members each comprises a peg having a front end for being threaded through a pair of aligned openings through said flange and the printed wiring board on which the shield is mounted and an enlarged rear end for clamping said flange against the printed wiring board.

4. A shield according to claim 1 wherein said shield consists, with the exception of said gasket, entirely of a shaped plate of metal, and said fastening members are integral extensions of said flange.

5. A shield according to claim 4 wherein each of said fastening members comprises a pair of side-by-side elongated prongs terminating in respective oppositely directed detents, said detents, in combination, providing a latch for securing the shield in place when said detents have been forced through an opening in the printing wiring board on which the shield is mounted.

6. A shield according to claim 4 wherein said groove has a rectilinear cross-section having a preselected depth, and said gasket has a circular cross-section having a cross-sectional diameter greater than said groove depth.

7. A shield according to claim 6 wherein said gasket is a pre-formed member forming a continuous loop having a length slightly less than the length of the loop of said groove, and said gasket is self-seating within said groove solely by elastic compressive stress.

8. An EMI shield for mounting on a first surface of a printing wiring board, the shield comprising an EMI impervious wall shaped to define a hollow space having an innermost portion spaced along a first direction from an opening into said space, an EMI impervious flange secured to said wall along a line completely encircling said opening and having an outer edge spaced from said line, a groove in a second surface of said flange facing in said first direction, said groove forming a closed, first loop spaced from said line and completely enclosing said opening, an electrically conducting, elastic gasket disposed within and projecting outwardly of said groove in said first direction along the entire length of said groove and electrically connected to said flange, and a plurality of fastening members spaced apart along said flange along a second loop encircling said opening and said first loop and spaced apart from said groove and said gasket within said groove, said fastening members extending in said first direction for securing said flange against said first surface of a printed wiring board and for elastically clamping the entire length of said gasket against said first surface.

9. An EMI shield according to claim 8 wherein said fastening members consist solely of materials of low electrical conductivity.

* * * * *